(12) United States Patent
Koch-Osborne

(10) Patent No.: US 6,568,947 B2
(45) Date of Patent: May 27, 2003

(54) APPARATUS FOR ROUTING A FLEXIBLE CIRCUIT

(75) Inventor: Andrew Koch-Osborne, Farnham (GB)

(73) Assignee: Nokia Mobile Phone Limited, Espoo (FI)

( * ) Notice: Subject to any disclaimer, the term of this patent is extended or adjusted under 35 U.S.C. 154(b) by 0 days.

(21) Appl. No.: 09/835,493

(22) Filed: Apr. 17, 2001

(65) Prior Publication Data

US 2002/0045370 A1 Apr. 18, 2002

(30) Foreign Application Priority Data

Oct. 13, 2000 (GB) ................................. 0025149

(51) Int. Cl.⁷ ................................................ H01R 3/00
(52) U.S. Cl. ................................................... 439/165
(58) Field of Search ................................. 439/164, 165, 439/31; 361/749, 814, 801, 683; 379/429; 499/97, 95

(56) References Cited

U.S. PATENT DOCUMENTS

| 5,390,075 A | * | 2/1995 | English et al. .............. 439/165 |
| 5,827,082 A | * | 10/1998 | Laine .......................... 439/165 |
| 6,093,038 A | * | 7/2000 | Chen et al. .................. 439/164 |
| 6,123,551 A | * | 9/2000 | Westfall ........................ 439/67 |
| 6,256,193 B1 | * | 7/2001 | Janik et al. .................. 361/683 |

FOREIGN PATENT DOCUMENTS

| EP | 0605827 | 12/1993 | ............. G06F/1/16 |
| EP | 0961370 | 12/1999 | |
| GB | 2323218 | 9/1998 | ......... G06K/19/077 |
| WO | 9723936 | 7/1997 | ........... H02G/11/00 |

* cited by examiner

Primary Examiner—Renee Luebke
Assistant Examiner—Felix D. Figueroa
(74) Attorney, Agent, or Firm—Antonelli, Terry, Stout & Kraus, LLP

(57) ABSTRACT

A portable electronic apparatus which includes first and second portions arranged to be movable relative to each other. Electrical connection between the portions is effected through use of a flexible electrical connector. The route of the connector between the two portions is impeded by an obstacle so that in a first configuration, the connector is constrained to follow a first route, and in a second configuration, the connector is constrained to follow a second, different, route.

22 Claims, 4 Drawing Sheets

APPARATUS FOR ROUTING A FLEXIBLE CIRCUIT

BACKGROUND OF THE INVENTION

This invention relates to an apparatus for electrically connecting a number of relatively movable parts using a flexible printed circuit. It finds particular utility in folding electronic apparatus such as personal organisers, laptop computers or mobile telephones.

It is desirable to be able to manufacture a number of portable electrical devices such that they can be folded into a relatively flat, minimal volume configuration when not in use, and unfolded, possibly to reveal further functional parts, when in use. As an example, it is convenient for a user of a portable telephone to be able to carry it unobtrusively about his person. However, small telephones can suffer from problems with smaller displays, smaller keypads, and reduced distance between loudspeaker and microphone which can adversely affect audio quality in each direction of communication. However, if a folding configuration is adopted for the telephone, a larger surface area can be made available for a given volume, when compared to a non-folding configuration. This mitigates the problems referred to above. For instance, a keypad and display can be concealed inside the folded telephone, to be revealed when the telephone is unfolded.

However, a problem with foldable electronic devices is how to electrically connect the two or more sections to each other. Known solutions have used wires and cables, either individually or in the form of ribbon cable, to connect the sections. However, such wires can be too bulky and inflexible to be used in today's miniature devices. The preferred method of connection now utilises a flexible connector, such as a flexible printed circuit board (PCB) to provide electrical connection.

Flexible PCBs consist of one or more insulating substrates onto which one or more layers of conductive tracks are printed, with the layers of conductive tracks being insulated from each other by respective layers of the substrate material.

A problem with such an arrangement, however, arises over the lifetime of the apparatus in which it is incorporated. A laptop computer, or a foldable telephone is generally designed to have a life-span of several years. As part of the life calculations for such a device, a certain number of folding and unfolding operations are required. It is not unusual for the number of such operations to be in the range of hundreds of thousands to greater than a million (100,000→>1,000,000). Such a large number of iterations places a great deal of stress on the moving parts of the folding apparatus and can result in malfunction before the specified number of operations has been reached.

FIGS. 1a and 1b shows the simplest possible method of using a flexible PCB to connect two halves of a foldable device, such as a telephone. In this case, rigid PCB 110 in a first half of the telephone 100 is connected to rigid PCB 120 in a second half of the telephone 100 by flexible PCB 130. The flexible PCB 130 passes through the hinge mechanism 140 holding the two halves of the telephone together.

As the telephone is opened, as shown in FIG. 1b, the flexible PCB moves through a large angle (generally in the range 0–180°). As the telephone is opened and closed repeatedly over many such cycles, the cumulative stress on the flexible PCB can cause damage to the conductive tracks. Also, this technique requires a large ungathered surplus of flexible PCB to be contained within the hinge mechanism in the closed position. This increases the chances of the flexible PCB 'kinking', and so damaging the connections it carries. It also requires the internal dimensions of the hinge mechanism to be larger than would otherwise be required in order to accommodate the excess flexible PCB.

The apparatus shown at FIGS. 1A and B is a rather simplistic view of how such interconnection may be achieved in practice. The hinge mechanism is generally more complicated, and may incorporate such additional elements as self-opening mechanism, locking mechanism or damping mechanisms. All these other elements make the passage of the flexible PCB through the hinge significantly more complicated. One way of overcoming such difficulties is disclosed in European patent application EP0961370. This patent application describes a flexible connection between two halves of a telephone which requires the flexible PCB to perform a helical twist along its length.

There is a possibility, in implementing such a system, that the flexible PCB is able to chafe against itself inside the hinge mechanism. Such chafing is then liable to adversely affect the electrical connection between the two halves of the telephone.

SUMMARY OF THE INVENTION

According to a first aspect of the present invention, there is provided a portable electronic apparatus comprising first and second portions, which are arranged such that the two portions are relatively movable between a first configuration and a second configuration, and are electrically connected together by a flexible electrical connector, wherein the route of the connector between the two portions is impeded by an obstacle, such that in the first configuration, the connector is constrained to follow a first route, and in the second configuration, the connector is constrained to follow a second, different, route.

According to a second aspect of the present invention, there is provided a portable electronic apparatus comprising first and second portions arranged in relatively movable connection via a hinge, the first and second portions being electrically connected via a flexible connector, wherein the flexible connector is routed through the hinge via an obstruction arranged to move with one of the portions, the obstruction taking the form of a plurality of structures projecting along lines substantially parallel to the axis of the hinge, about which structures the connector is routed, and at a given relative position of the two portions, one of the plurality of structures plays no part in the routing of the connector.

An advantage of this invention is the provision of a means of reliable electrical interconnection between two parts of an apparatus which are movable in relation to each other.

Another advantage of this invention is that the stress and strain to which the flexible connector is subjected throughout the opening and closing operations of the portable apparatus are kept at acceptable, determinable levels. This is achieved by routing the connector through the hinge in such a way that the connector follows a defined route, which alters as the configuration of the apparatus alters, and maintains a substantially constant length for all relative positions of the apparatus.

The constant length route is achieved through careful selection of a series of obstacles which act to guide the connector on a defined routed through the hinge. The positions and sizes of the obstacles are carefully chosen so that the route taken by the connector does not alter its length significantly in moving from a fully open to a fully closed configuration.

An embodiment of the invention guides the connector around a series of projections attached to a plate arranged so that the plate rotates in accordance with the position of the hinge. In this way, the exact route taken by the flexible connector varies in relation to the relative position of the parts of the foldable apparatus. The plate may be made to move in relation to the hinge position by attaching it to one portion of the apparatus.

An embodiment of the invention employs three cylindrical projections disposed across the diameter of a circular plate, and arranged to extend longitudinally in a direction parallel to the axis of rotation of the two portions. The connector is routed through the projections such that in one extreme configuration, the connector contacts opposing sides of adjacent projections.

Conveniently, the projections are arranged to be disposed within a spool which may be fitted into the hinge mechanism of the apparatus.

At one extreme of movement of the two parts, all projections play a part in forming the route followed by the flexible connector. At the other extreme of movement, one of the projections plays no part in forming the route. Consequently, at some given point in the range of possible relative positions of the two portions, one of the projections ceases to be involved in forming the route.

An advantage of embodiments of the invention is that the route taken by the connector is repeatable and predictable. That is, for a given position of the first portion relative to the second portion, the route of the connector can be determined.

It is found that flexible connectors have a minimum bend radius, which if violated increases the likelihood of damage to the conductive tracks, which in turn compromises the electrical connection between the sections of the apparatus. An aspect of this invention is the routing of the flexible connector via an obstacle in such a way that the minimum bend radius is not reached, thus mitigating possible damage to the connector.

Advantageously, the flexible connector may be in the form of a flexible printed circuit board, which may be manufactured by one of a number of known processes.

A preferred embodiment of the apparatus is a portable telephone, particularly a foldable portable telephone.

Another embodiment has the first portion accommodating a display, and the second portion accommodating a keyboard.

For a better understanding of the present invention, and to understand how the same may be brought into effect, the invention will now be described, by way of example only, with reference to the appended drawings in which:

DETAILED DESCRIPTION OF THE DRAWINGS

Figure 1A:
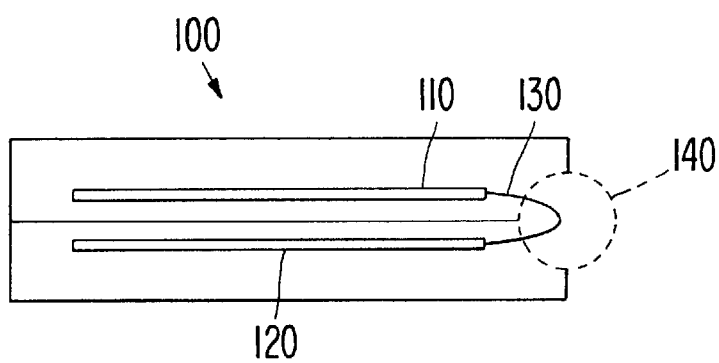
FIGS. 1A and B shows a prior art solution to the problem of electrically connecting hinged components of a portable electronic device.
Figure 1B:
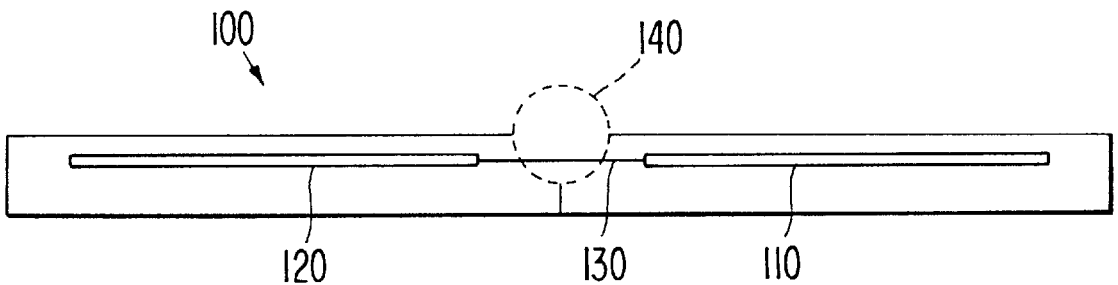
Figure 2:
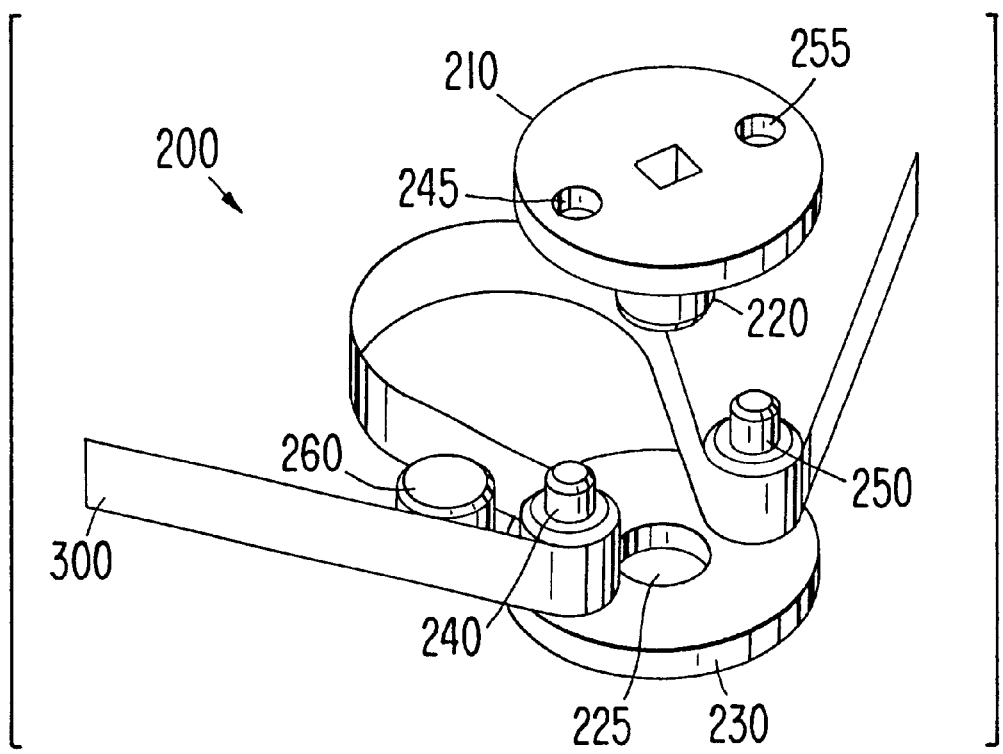
FIG. 2 shows an exploded profile view of a hinge component according to an embodiment of the present invention.

FIG. 2 shows an exploded view of a spool 200 which forms part of the hinge mechanism of a foldable portable electronic device, such as a mobile telephone. The spool 200 comprises two interlocking portions. Both portions are flat discs having one or more spindles and apertures. Both discs are manufactured from a suitable plastics material.

The first portion 210 has a spindle 220 extending from the disc surface. The spindle is circular in cross section and is concentric with the disc. The first portion 210 also has two apertures 245, 255 disposed one each side of the central spindle, towards the outer perimeter of the disc. The apertures and the central spindle 220 thus lie on a diameter of the disc.

The second portion 230 may be considered to be constructed as an inverse of the first portion in that it has an aperture 225 positioned concentric with the disc. It also has two spindles 240, 250 disposed one each side of the central aperture 225, towards the outer perimeter of the disc. The aperture and the spindles thus lie on a diameter of the disc.

The correspondence between apertures on one disc and spindles on the other provides for a mating connection between the two discs. Each spindle 220, 240, 250 is shaped so as to provide a firm frictional fit with its respective corresponding aperture 225, 245, 255 in the other portion of the spool 200.

In the particular embodiment shown, all spindles are equally dimensioned, and adjacent spindles are equidistant from each other. However, other configurations are possible which would operate similarly.

Figure 3:
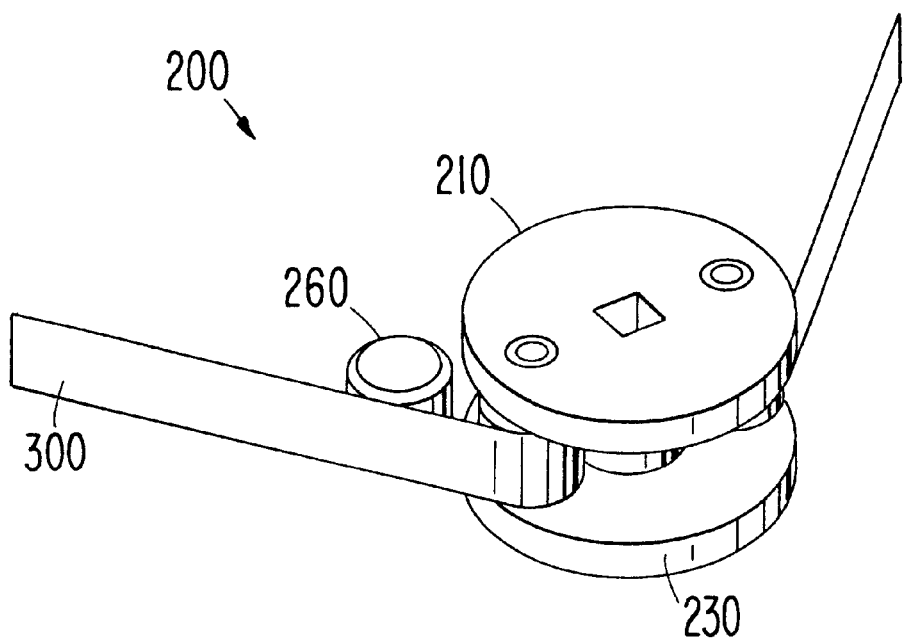
FIG. 3 shows a profile view of a hinge component according to an embodiment of the present invention.

FIG. 3 shows the spool 200 when the first and second portions 210, 230 are mated together.

The axis of rotation of the hinge of the foldable apparatus is co-axial with the spindle 220 of the first portion of the spool. That is to say that the spool rotates about its central axis. The spool is positioned in the hinge of the apparatus so that the spool is fixed relative to one movable part of the foldable apparatus, and rotates with the hinge axis relative to another movable part of the apparatus.

FIG. 2 shows the passage through the spool 200 of the flexible connector 300. In this instance, the flexible connector is a flexible printed circuit board (PCB) comprising one or more conductive signal tracks, on one or more layers, printed onto one or more insulating substrates.

The flexible PCB may be a unitary element which accommodates components in each part of the foldable apparatus, or alternatively, each part of the apparatus may have its own separate PCB, which may be flexible or rigid, which is connected to the other by a length of flexible PCB.

PCB 300 is first guided past fixed spindle 260. Spindle 260 is fixed in position in one movable part of the apparatus, and so the spool moves relative to spindle 260. The spindle 260 acts to ensure that the PCB enters the spool at a defined orientation, regardless of the rotational position of the spool.

FIG. 2 shows the position of the spool when the two parts of the foldable apparatus are positioned at approximately 45° to each other. The PCB is guided around the three spindles of the spool such that it makes a pass around spindle 240 in an anti-clockwise direction; it then makes a pass around the central spindle 220 in a clockwise direction; and then makes a pass around the final spindle 250 in an anti-clockwise direction before emerging from the spool. As the connector passes through the spool, it is merely guided around each projection before either being guided around another, or exiting from the spool altogether.

Figure 4A:
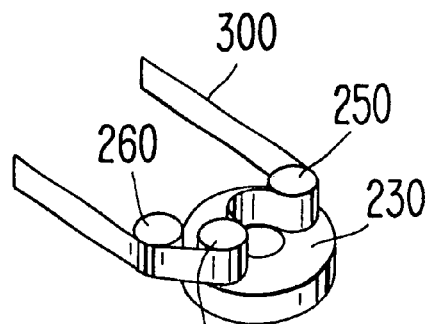
FIGS. 4a–c show profile views of the hinge component of FIGS. 2 and 3 in various positions between open and closed positions of the portable electronic apparatus.
Figure 4B:
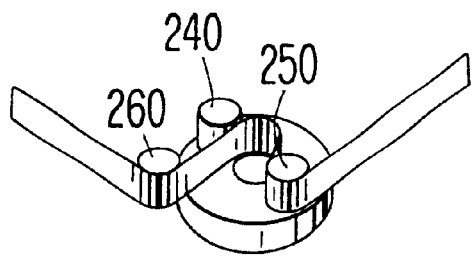
Figure 4C:
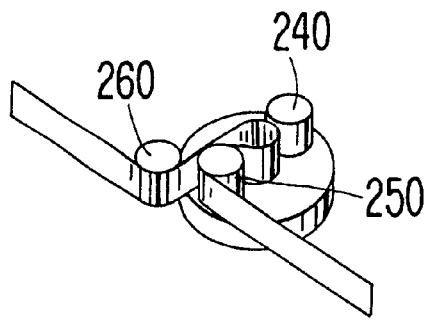

FIGS. 4a–c show perspective views of the spool as it is when the apparatus is in (a) the closed position, (b) an intermediate position and (c) the fully open position. In each view, only the lower portion 230 of the spool is shown; the top portion 210 has been removed for clarity, so that the route of the flexible PCB 300 can be followed through the spool.

In FIG. 4a, it can be seen that the PCB 300, passes at least part of the way around each of the three spindles 240, 250 and 220 (not shown), before exiting the spool. As the apparatus comprising the spool is opened, to the intermediate position shown in FIG. 4b, spindle 240 plays no further part in guiding the PCB through the spool, and its route is determined solely by spindles 220 and 250.

As the apparatus is opened further to the fully open position shown in FIG. 4c, the PCB makes almost a complete circuit of the central spindle 220, before passing around spindle 250 to exit the spool.

FIGS. 4a–c show the route taken by the PCB at three distinct points in the complete range of movement of the apparatus, but it is simple to envisage the points intermediate to those shown.

The configuration chosen for the spool 200 is inspired by the realisation that in order to minimise stress, strain, fatigue and kinking of the flexible PCB during its passage through the hinge of a foldable electronic apparatus it is desirable, amongst other factors, to:

seek to exercise some degree of control over its route through the hinge;

configure the rote taken such that the connector does not experience any bends smaller than the minimum bend radius;

attempt to ensure that stretching of the PCB is maintained within predefined limits; and attempt to reduce friction (both against other parts and itself).

The embodiment so far described addresses these issues by:

arranging the connector's route such that it generally follows a consistent defined path for relative positions of the foldable apparatus;

guiding the connector through the spool around spindles which have a radius which is larger than the minimum bend radius; and configuring the spool such that the path followed by the PCB is substantially the same length for any given position of the foldable apparatus.

Figure 5A:
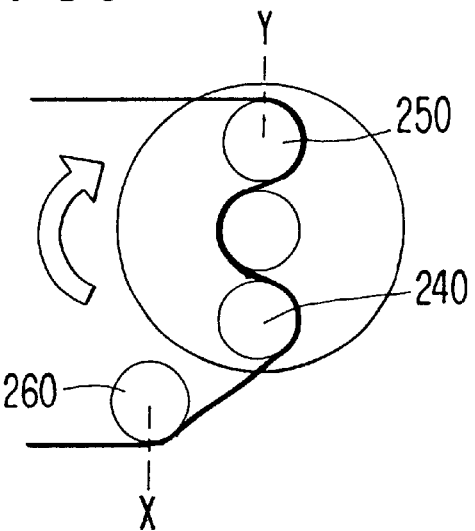
FIGS. 5a–c show plan views of the hinge component of in equivalent positions to those shown in FIGS. 4a–c.
Figure 5B:
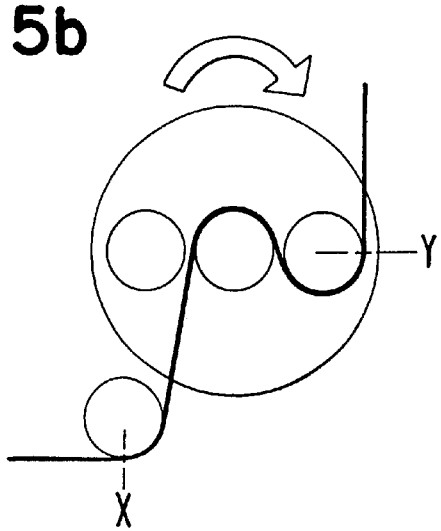
Figure 5C:
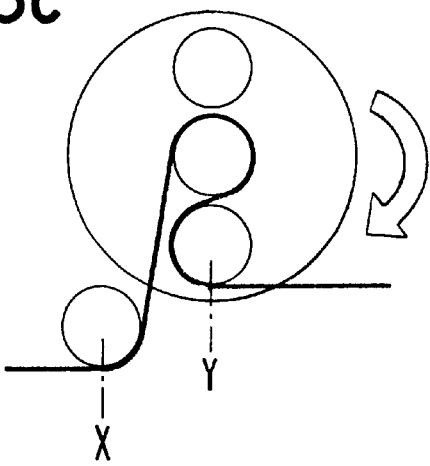

FIGS. 5a–c correspond to the position of the apparatus shown in FIGS. 4a–c, but are shown in plan view for ease of understanding.

FIG. 5a shows the position of the spool with the apparatus in the closed configuration. The points marked X and Y are the entry and exit points respectively of the spool. The length of PCB between these points is the length which requires some form of management so that the possibility of it incurring damage, in any of the ways so far mentioned, is kept to a minimum.

As the spool moves through its entire range of angles between the positions shown in FIGS. 5a and 5c, it is found in practice that the length of the route between points X and Y only varies by a small amount. Such a small variation helps to minimise the frictional forces experienced by the PCB throughout its lifetime, and also yields the result that on the one hand, there is not a large amount of slack PCB occupying the space in the hinge where it could be damaged, and on the other hand, that the PCB is not subjected to any great strain during movement of the apparatus between open and closed positions.

In the light of the foregoing description, it will be clear to the skilled man that various modifications may be made within the scope of the invention. In particular, an embodiment has been described which shows a folding telephone. The skilled man will realise that the invention can be equally applied to any apparatus which requires electrical connection between two or more components having a rotational connection. For instance, the invention could be used to facilitate connection between the display portion of a laptop computer and the keyboard section, or the viewfinder of a digital camera and the lens section.

The spool for routing the connector may be made to any dimension whilst maintaining the general configuration described previously. In this way, the spool can be adapted to route a connector having a large number of individual conductive tracks, in which case the projections about which the connector is guided may be made longer. The spool may be scaled up or down in dimension to suit a particular apparatus and/or connector material.

The present invention includes any novel feature or combination of features disclosed herein either explicitly or any generalisation thereof irrespective of whether or not it relates to the claimed invention or mitigates any or all of the problems addressed.

What is claimed is:

1. A portable electronic apparatus comprising:

first and second portions, which are attached to each other by a hinge, said first and second portions being pivotally movable relative to each other by said hinge between a first configuration and a second configuration, and said first and second portions being electrically connected to each other by a flexible electrical connector which follows a different route within the hinge based on the configuration of said first and second portions, wherein the route the connector follows within the hinge, between an inlet and an outlet of the hinge, is defined by an obstacle disposed within the hinge, such that in the first configuration, the connector is constrained by the obstacle to follow a first route within the hinge, and in the second configuration, the connector is constrained by the obstacle to follow a second route, different from the first route, within the hinge, wherein said obstacle includes a plurality of obstructions and the connector is threaded through said obstructions in such a manner that the connector wraps about a substantial portion of a circumference of each of at least two of said obstructions when said first and second portions are in the first and second configurations.

2. A portable electronic apparatus as claimed in claim 1 wherein the first and second configurations represent extremes of movement of the two portions of the apparatus.

3. A portable electronic apparatus as claimed in claim 1 wherein the flexible electrical connector is a flexible printed circuit board (PCB).

4. A portable electronic apparatus as claimed in claim 1 wherein the first portion comprises a keyboard and the second portion comprises a display.

5. A portable electronic apparatus as claimed in claim 1 wherein the first and second portions are mechanically connected along an axis of rotation.

6. A portable electronic apparatus as claimed in claim 5 wherein the axis of rotation is provided by a hinge.

7. A portable electronic apparatus as claimed in claim 1 wherein the obstacle is arranged to move with one of the portions.

8. A portable electronic apparatus as claimed in claim 1 wherein the obstacle is provided by a plurality of projections arranged parallel to an axis of rotation.

9. A portable electronic apparatus as claimed in claim 8, wherein one of the projections ceases to play a part in the route of the connector at a given relative position of the first and second portions.

10. A portable electronic apparatus as claimed in claim 7 wherein the obstacle is incorporated into a spool mounted coaxially with an axis of rotation.

11. A portable electronic apparatus as claimed in claim 1 wherein the portable electronic apparatus is a portable telephone.

12. A portable electronic telephone as claimed in claim 11 wherein the telephone is a foldable telephone and the first and second configurations correspond to relatively open and closed configurations of the telephone.

13. A portable electronic apparatus comprising:
first and second portions, which are arranged such that the two portions are relatively movable between a first configuration and a second configuration, and are electrically connected by a flexible electrical connector,
wherein a route of the connector between the two portions is defined by an obstacle, such that in the first configuration, the connector is constrained to follow a first route through the obstacle, and in the second configuration, the connector is constrained to follow a second route, different from the first route,
wherein the obstacle is provided by a plurality of projections arranged parallel to an axis of rotation, and
wherein the projections are cylindrical in shape.

14. A portable electronic apparatus as claimed in claim 13 wherein the projections are substantially dimensionally similar.

15. A portable electronic apparatus comprising:
first and second portions, which are arranged such that the two portions are relatively movable between a first configuration and a second configuration, and are electrically connected by a flexible electrical connector,
wherein a route of the connector between the two portions is defined by an obstacle, such that in the first configuration, the connector is constrained to follow a first route through the obstacle, and in the second configuration, the connector is constrained to follow a second route, different from the first route,
wherein the obstacle is provided by a plurality of projections arranged parallel to an axis of rotation, and
wherein the projections are arranged to have a radius larger than a maximum bend radius of the flexible connector.

16. A portable electronic apparatus comprising:
first and second portions, which are attached to each other by a hinge, said first and second portions being pivotally movable relative to each other by said hinge, said first and second portions being electrically connected to each other by a flexible connector which follows a different route within the hinge based on a relative position of said first and second portions,
wherein the route the flexible connector follows within the hinge, between an inlet and an outlet of the hinge, is defined by an obstruction disposed within the hinge that moves with one of said first and second portions, the obstruction taking the form of a plurality of projections which project along lines substantially parallel to an axis of the hinge, about which projections the flexible connector is routed, and at a given relative position of said first and second portions with respect to each other, one of the plurality of projections plays no part in the routing of the flexible connector, and
wherein the route the flexible connector follows through the hinge as defined by the obstruction alters as the relative position of said first and second portions changes,
wherein said obstruction includes a plurality of elements and the connector is threaded through said elements in such a manner that the connector wraps about a substantial portion of a circumference of each of at least two of said elements when said first and second portions are in the first and second portions.

17. A portable electronic apparatus as claimed in claim 16 wherein the projections are arranged collinearly.

18. A portable electronic apparatus as claimed in claim 16 wherein the number of projections is three.

19. A portable electronic apparatus comprising:
first and second portions; and
a hinge which attaches said first and second portions to each other so as to be pivotally movable relative to each other between a first configuration and a second configuration,
wherein said first and second portions are electrically connected to each other by a flexible electrical connector which follows a route within the hinge,
wherein said hinge comprises:
an obstacle which is disposed within said hinge,
wherein said obstacle defines the route the connector follows within said hinge, between an inlet and an outlet of the hinge such that in the first configuration, the connector is constrained by the obstacle to follow a first route within said hinge, and in the second configuration, the connector is constrained by the obstacle to follow a second route, different from the first route, within the hinge,
wherein said obstacle includes a plurality of obstructions and the connector is threaded through said obstructions in such a manner that the connector wraps about a substantial portion of a circumference of each of at least two of said obstructions when said first and second portions are in the first and second configurations.

20. A portable electronic apparatus comprising:
first and second portions; and
a hinge which attaches said first and second portions to each other so as to be pivotally movable relative to each other by said hinge,
wherein said first and second portions are electrically connected to each other by a flexible electrical connector which follows a different route within the hinge based on a relative position of said first and second portions,
wherein said hinge comprises:
an obstruction which is disposed within said hinge,
wherein the route the flexible connector follows within the hinge, between an inlet and an outlet of the hinge, is defined by said obstruction which moves with one of said first and second portions,
wherein said obstruction takes the form of a plurality of projections which project along lines substantially parallel to an axis of said hinge, about which projections the flexible connector is routed, wherein at a given relative position of said first and second portions with respect to each other, one of the plurality of projections plays no part in the routing of the flexible connector, wherein the route the flexible connector follows through said hinge as defined by said obstruction alters as the relative position of said first and second portions changes, and wherein the flexible connector is threaded through said projections in such a manner that the flexible connector wraps about a substantial portion of a circumference of each of at least two of said projections when said first and second portions are in first and second portions.

21. A portable electronic apparatus comprising:

first and second portions, which are attached to each other by a hinge, said first and second portions being pivotally movable relative to each other by said hinge between a first configuration and a second configuration, and said first and second portions being electrically connected to each other by a flexible electrical connector which follows a different route within the hinge based on the configuration of said first and second portions, wherein the route the connector follows within the hinge between an inlet and an outlet of the hinge is defined by an obstacle disposed within the hinge, such that in the first configuration, the connector is constrained by the obstacle to follow a first route with the hinge, wherein said obstacle includes a plurality of obstructions and the connector is threaded through said obstructions in such a manner that the connector wraps about a substantial portion of a circumference of each of the at least two of said obstructions when said first and second portions are in the first and second configurations and in the second configuration, the connector is constrained by the obstacle to follow a second route, different from the first route, within the range.

22. A portable electronic apparatus comprising:

first and second portions, which are attached to each other by a hinge, said first and second portions being pivotally movable relative to each other by said hinge between a first configuration and a second configuration, and said first and second portions being electrically connected to each other by a flexible electrical connector which follows a different route within the hinge based on the configuration of said first and second portions, wherein the route the connector follows within the hinge is defined by an obstacle disposed within the hinge, such that the obstacle progressively alters the route followed by the connector within the hinge as the first and second portions are moved one relative to the other wherein said obstacle includes a plurality of obstructions and the connector is threaded through said obstructions in such a manner that the connector wraps about a substantial portion of a circumference of each of the at least two of said obstructions when said first and second portions are in the first and second configurations.

* * * * *

UNITED STATES PATENT AND TRADEMARK OFFICE
CERTIFICATE OF CORRECTION

PATENT NO. : 6,568,947 B2  
APPLICATION NO. : 09/835493  
DATED : May 27, 2003  
INVENTOR(S) : Koch-Osborne Page 1 of 1

It is certified that error appears in the above-identified patent and that said Letters Patent is hereby corrected as shown below:

Column 7, line 53, after "larger than a" "maximum" should read -- minimum --.

Column 10, line 8, after ", within the" "range" should read -- hinge --.

Signed and Sealed this

Twenty-second Day of January, 2008

JON W. DUDAS  
*Director of the United States Patent and Trademark Office*